(12) United States Patent
Muratsuchi et al.

(10) Patent No.: US 10,299,418 B2
(45) Date of Patent: May 21, 2019

(54) COMPONENT MOUNTING SYSTEM

(71) Applicant: FUJI CORPORATION, Chiryu (JP)

(72) Inventors: Hiroaki Muratsuchi, Hashima-gun (JP); Takashi Kurashina, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 318 days.

(21) Appl. No.: 14/765,945

(22) PCT Filed: Feb. 22, 2013

(86) PCT No.: PCT/JP2013/054474
§ 371 (c)(1),
(2) Date: Aug. 5, 2015

(87) PCT Pub. No.: WO2014/128913
PCT Pub. Date: Aug. 28, 2014

(65) Prior Publication Data
US 2015/0382521 A1 Dec. 31, 2015

(51) Int. Cl.
*B23P 19/00* (2006.01)
*H05K 13/04* (2006.01)
(Continued)

(52) U.S. Cl.
CPC ..... *H05K 13/0408* (2013.01); *G06F 17/5009* (2013.01); *H05K 13/028* (2013.01);
(Continued)

(58) Field of Classification Search
CPC ........... H05K 13/0452; H05K 13/0404; Y10T 29/4913; Y10T 29/53178; Y10T 29/53174; Y10T 29/53091; Y10T 29/53
(Continued)

(56) References Cited

U.S. PATENT DOCUMENTS 6,996,440 B2 * 2/2006 Maenishi ........... H05K 13/0452
29/740
7,200,922 B2 * 4/2007 Kabeshita .......... H05K 13/0061
29/740
(Continued)

FOREIGN PATENT DOCUMENTS

CN 101080963 A 11/2007
JP 2002 280793 9/2002
(Continued)

OTHER PUBLICATIONS

Combined Chinese Office Action and Search Report dated Apr. 13, 2017 in Patent Application No. 201380073571.1 (with English Translation and English Translation of Category of Cited Documents).
(Continued)

*Primary Examiner* — Thiem D Phan
(74) *Attorney, Agent, or Firm* — Oblon, McClelland, Maier & Neustadt, L.L.P.

(57) ABSTRACT

A component mounting system that efficiently determines a component as a bulk component to be mounted on a bulk feeder through a simulation, and a bulk component determining method. The component mounting system includes a printed-circuit-board conveyance section that includes conveyance lanes and which convey a plurality of different types of printed circuit boards, a component supply section, a mounting head, a bulk feeder, and a bulk component determining section that performs a simulation in which operation times when the components supplied from the component supply section are moved on the printed circuit boards on the conveyance lanes are calculated for all the components and determines the bulk component to be mounted on the bulk feeder based on the calculated operation times.

6 Claims, 13 Drawing Sheets

(51) Int. Cl.
*H05K 13/08* (2006.01)
*G06F 17/50* (2006.01)
*H05K 13/02* (2006.01)

(52) U.S. Cl.
CPC ......... *H05K 13/043* (2013.01); *H05K 13/046* (2013.01); *H05K 13/08* (2013.01); *H05K 13/085* (2018.08); *Y10T 29/53174* (2015.01)

(58) Field of Classification Search
USPC ......... 29/739, 740, 743, 759, 787, 829, 830, 29/831, 832, 836
See application file for complete search history.

(56) References Cited

U.S. PATENT DOCUMENTS

| | | |
|---|---|---|
| 2006/0052893 A1 | 3/2006 | Yamazaki et al. |
| 2008/0154392 A1 | 6/2008 | Maenishi et al. |

FOREIGN PATENT DOCUMENTS

| | | | |
|---|---|---|---|
| JP | 2002-280793 A | | 9/2002 |
| JP | 2006 515118 | | 5/2006 |
| JP | 2008 270332 | | 11/2008 |
| JP | 2010 199630 | | 9/2010 |
| JP | 2010199630 | * | 9/2010 |

OTHER PUBLICATIONS

International Search Report dated Apr. 16, 2013 in PCT/JP2013/054474 filed Feb. 22, 2013.
Office Action dated Nov. 23, 2017 in Chinese Patent Application No. 201380073571.1 (submitting English language translation only).

* cited by examiner

FIG. 9

REDUCTION TIME FOR ALL COMPONENTS

| | COMPONENT TYPE | REDUCTION TIME IN LANE 1 | REDUCTION TIME IN LANE 2 |
|---|---|---|---|
| 1 | PA | T1A | T2A |
| 2 | PB | T1B | T2B |
| 3 | PC | T1C | |
| 4 | PD | T1D | T2D |
| 5 | PE | T1E | |
| ⋮ | ⋮ | ⋮ | ⋮ |

FIG. 12

REDUCTION TIME FOR ALL COMPONENTS

| | COMPONENT TYPE | REDUCTION TIME IN PRODUCTION JOB 1 | REDUCTION TIME IN PRODUCTION JOB 2 | REDUCTION TIME IN PRODUCTION JOB 3 |
|---|---|---|---|---|
| 1 | PA | T1A' | T2A' | T3A' |
| 2 | PB | T1B' | T2B' | T3B' |
| 3 | PC | T1C' | T2C' | |
| 4 | PD | T1D' | | T3D' |
| 5 | PE | T1E' | T2E' | T3E' |
| ⋮ | ⋮ | ⋮ | ⋮ | ⋮ | though the number of components to be mounted is small is effective in reducing the production time.

COMPONENT MOUNTING SYSTEM

TECHNICAL FIELD

The present disclosure relates to a component mounting system that mounts components on a plurality of different types of printed circuit boards, and a bulk component determining method used in the same.

BACKGROUND ART

In general, for example, as described in PTL 1, a component mounting machine is configured such that components supplied by a component supply section provided on a base are sucked by a suction nozzle provided at a mounting head and the sucked components are mounted on a printed circuit board on a conveyance lane.

Incidentally, a component mounting machine that holds a bulk feeder by the mounting head in addition to the component supply section provided on the base and mounts components supplied from the component supply section or the bulk feeder on the printed circuit board has been filed by the present applicant (Japanese Patent Application No. 2011-206452). In such a component mounting machine that holds the bulk feeder by the mounting head, since the components (bulk component) supplied from the bulk feeder are sequentially sucked by the suction nozzle without moving the mounting head and the sucked components can be successively mounted on the printed circuit board, it is not necessary to move the mounting head between the component supply section and the printed circuit board. Accordingly, it is possible to reduce the production time of the printed circuit board.

In this case, since there is a limit on the number of bulk feeders that can be held by the mounting head, determining the component to be mounted on the bulk feeder as the bulk component becomes an important key to reduce the production time. For example, in a component mounting machine in which two-row conveyance lanes that respectively convey different types of two printed circuit boards are provided in parallel, mounting a large number of components on the bulk feeder does not necessarily contribute to reduction of the production time, and it is necessary to take into account the movement time necessary to move the components supplied from the component supply section to a position above the printed circuit board.

CITATION LIST

Patent Literature

PTL 1: JP-A-2010-199630

BRIEF SUMMARY

Technical Problem

An example thereof will be described with reference to FIG. 13. In a case where components supplied from a component supply section 20 are mounted on printed circuit boards B1 and B2 on two-row conveyance lanes L1 and L2 that convey two different types of printed circuit boards, even though the number (N2) of components mounted on the printed circuit board B2 on the conveyance lane L2 close to the component supply section 20 as shown in FIG. 13(B) is greater than the number (N1) of components mounted on the printed circuit board B1 on the conveyance lane L1 far away from the component supply section 20 as shown in FIG. 13(A), when movement distances (movement times) D1 and D2 of the mounting head from the component supply section 20 to the printed circuit boards B1 and B2 on the respective conveyance lanes L1 and L2 are taken into account, mounting the components mounted on the printed circuit board B1 on the conveyance lane L1 far away from the component supply section 20 on the bulk feeder even though the number of components to be mounted is small is effective in reducing the production time.

That is, in FIG. 13, a greater value of a value (t1×N1), which is obtained by multiplying a time (t1) required to move a distance D1 from a central coordinate of the printed circuit board B1 on the conveyance lane L1 far away from the component supply section 20 to a component supply position of the component supply section 20 and the number (N1) of components to be mounted, and a value (t2×N2), which is obtained by multiplying a time (t2) required to move a distance D2 from a central coordinate of the printed circuit board B2 on the conveyance lane L2 close to the component supply section 20 to a component supply position of the component supply section 20 and the number (N2) of components to be mounted, becomes a greater reduction time.

Accordingly, in the component mounting machine in which different printed circuit boards are conveyed to the two-row conveyance lanes, it is possible to reduce the production time of the printed circuit boards the most by mounting a component of which an operation time when the components are supplied from the component supply section is the longest on a bulk head held by the mounting head, without taking into account the number of components to be mounted. The same is true of a case where components to be mounted on the bulk feeder are determined among components used for a plurality of different types of printed circuit boards in a component mounting machine having a single conveyance lane, as well as the component mounting machine having the two-row conveyance lanes.

The present disclosure has been made in view of the foregoing circumstances, and it is an object of the present disclosure to provide a component mounting system in which a component to be mounted on a bulk feeder as a bulk component is effectively determined through a simulation before a plurality of different types of printed circuit boards is produced, and a bulk component determining method used in the same.

Solution to Problem

In order to solve the above-described problem, an aspect of the present disclosure provides a component mounting system including a printed-circuit-board conveyance section that includes conveyance lanes which convey a plurality of different types of printed circuit boards, a component supply section that supplies components to be mounted on the plurality of printed circuit boards, amounting head that includes suction nozzles which suck the components supplied from the component supply section, and mounts the components sucked by the suction nozzles on the printed circuit boards, a bulk feeder that is integrally held by the mounting head, and mounts at least one type of bulk component sucked by the suction nozzles; and a bulk component determining section that performs a simulation in which operation times when the components supplied from the component supply section are moved on the printed circuit boards on the conveyance lane are calculated for all the components, and determines a bulk component to be mounted on the bulk feeder based on the calculated operation times.

An aspect of the present disclosure provides the component mounting system, in which two conveyance lanes that respectively convey different types of printed circuit boards are arranged in parallel at the printed-circuit-board conveyance section, and the components supplied from the component supply section are mounted on the respective printed circuit boards conveyed by the two conveyance lanes.

An aspect of the present disclosure provides the component mounting system, in which the bulk component determining section includes operation time calculating means for respectively calculating operation times when the components supplied from the component supply section are transferred to the printed circuit boards on the two-row conveyance lanes, and selection means for selecting the component of which the operation time is long as a bulk component, among the operation times for all the components on the plurality of different types of printed circuit boards which are calculated by the operation time calculating means.

An aspect of the present disclosure provides a bulk component determining method used by a component mounting system that mounts a plurality of components supplied from a component supply section on a plurality of different types of printed circuit boards conveyed by two-row conveyance lanes. The method includes performing a simulation in which operation times when the components supplied from the component supply section are moved on the printed circuit boards on the two-row conveyance lanes are calculated for all the components, selecting the component of which the operation time is long, among the operation times for all the components which are calculated through the simulation, and determining the selected component as a bulk component to be mounted on a bulk feeder held by the mounting head.

Advantageous Effects

According to an aspect of the present disclosure, since the bulk feeder that mounts at least one type of bulk component sucked by the suction nozzles integrally held by the mounting head, and the bulk component determining section that performs the simulation in which the operation times when the components supplied from the component supply section are moved to the printed circuit boards on the conveyance lanes are calculated for all the components, and determines the bulk components to be mounted on the bulk feeder based on the calculated operation times are provided, it is possible to determine the component that effectively reduces the production time as the bulk component in producing the different types of printed circuit boards. Thus, it is possible to establish the component mounting system capable of optimizing the arrangement of the components on the component supply section and the bulk feeder, and it is possible to effectively reduce the production time when the different types of printed circuit boards are produced.

According to an aspect of the present disclosure, the two conveyance lanes that respectively convey the different types of printed circuit boards are arranged in parallel at the printed-circuit-board conveyance section, and the components supplied from the component supply section are mounted on the respective printed circuit boards conveyed by the two conveyance lanes. Thus, it is possible to supply the components in consideration of the reduction in production time when the printed circuit boards are produced in the component mounting system including the dual lanes, and it is possible to effectively reduce the production time when the printed circuit boards are produced.

According to an aspect of the present disclosure, since the bulk component determining section includes the operation time calculating means for respectively calculating the operation times when the components supplied from the component supply section are transferred to the printed circuit boards on the two-row conveyance lanes, and the selection means for selecting the component of which the operation time is long, among the operation times of all the components on the plurality of different types of printed circuit boards which are calculated by the operation time calculating means, as the bulk component, it is possible to accurately reduce the production time of the printed circuit boards by the operation time calculating means and the selecting means.

According to an aspect of the present disclosure, the simulation in which the operation times when the components supplied from the component supply section are moved to the printed circuit boards on the two-row conveyance lanes are calculated for all the components is performed, the component of which the operation time is long, among the operation times for all the components calculated through the simulation, is selected, and the selected component is determined as the bulk component to be mounted on the bulk feeder held by the mounting head. Thus, it is possible to determine the component that effectively reduces the production time as the bulk component in producing the different types of printed circuit boards. Accordingly, it is possible to implement the bulk component determining method capable of optimizing the arrangement of the components on the component supply section and the bulk feeder, and it is possible to effectively reduce the production time when the different types of printed circuit boards are produced.

BRIEF DESCRIPTION OF DRAWINGS

FIG. 9 is a diagram showing a table in which reduction times in the respective lanes are recorded in the first embodiment.

FIG. 12 is a diagram showing a table in which reduction times in the respective production jobs are recorded in the second embodiment.

DETAILED DESCRIPTION

Figure 1:
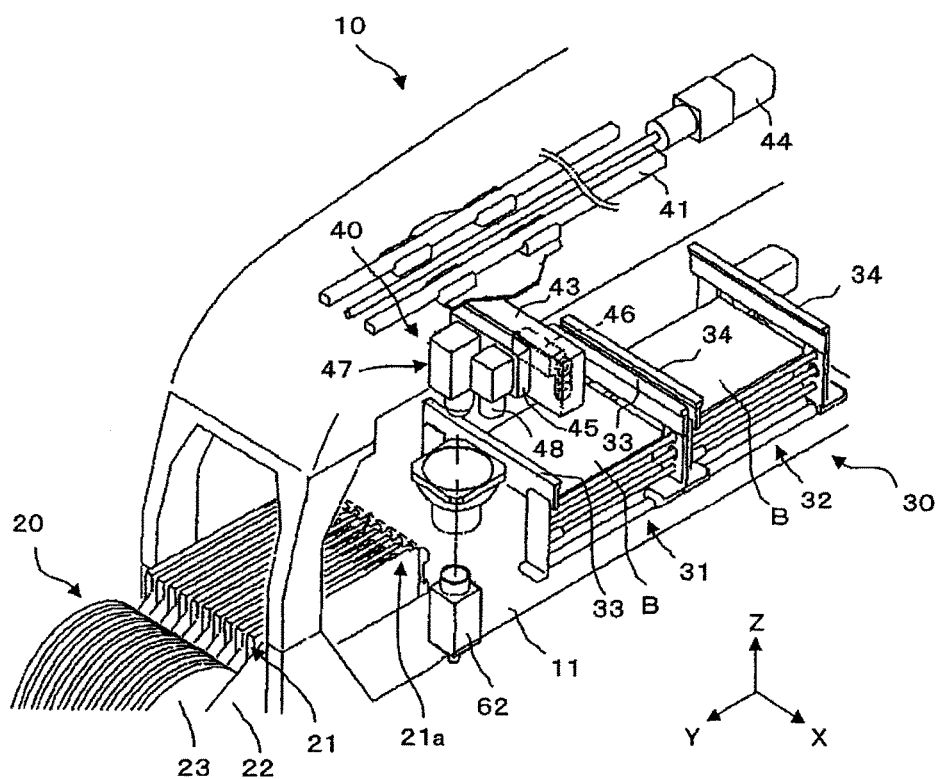
FIG. 1 is a perspective view showing the entire component mounting system according to a first embodiment of the present disclosure.

Hereinafter, embodiments of the present disclosure will be described with reference to the drawings. As shown in FIG. 1, a component mounting system 10 includes a component supply section 20, a printed-circuit-board conveyance section 30, and a component transfer section 40.

For example, the component supply section 20 is configured such that a plurality of tape feeders 21 is arranged in parallel in an X-axis direction on a base 11. The tape feeder 21 includes a supply reel 23 that is detachably mounted to a main body frame 22 which is separably attached to the base 11 and around which a tape which accommodates a plurality of electronic components in a line with space is wound. Although not shown, a motor which is a drive source that pitch-feeds the tape is embedded within the tape feeder 21, the tape is fed pitch by pitch by this motor, and the electronic components accommodated in the tape are sequentially supplied to a component supply position 21a provided on a distal end of the tape feeder 21.

The printed-circuit-board conveyance section 30 is a unit which conveys circuit boards B in the X-axis direction and positions and holds the conveyed circuit boards in a predetermined position, and is configured as a dual lane type in which conveyance lanes 31 and 32 are arranged in parallel in two rows in a Y direction crossing the X-axis direction. The respective conveyance lanes 31 and 32 are horizontally arranged such that a pair of guide rails 33 and a pair of guide rails 34 respectively face each other in parallel on the base 11. A pair of conveyor belts (not shown) that supports and conveys the circuit boards B guided by the guide rails 33 and 34 is arranged in parallel at the conveyance lanes 31 and 32.

The component transfer section 40 is an XY robot, and the XY robot is laid on the base 11 and is disposed above the component supply section 20 and the printed-circuit-board conveyance section 30, and includes a Y-axis slider 43 that can move along a guide rail 41 in a Y-axis direction. The Y-axis-direction movement of the Y-axis slider 43 is controlled by a servomotor 44 through a ball screw. An X-axis slider 45 is guided and supported by the Y-axis slider 43 so as to move in the X-axis direction, and the X-axis-direction movement of the X-axis slider 45 is controlled by a servomotor 46 through a ball screw.

As will be described below, a mounting head 47 including suction nozzles for sucking the electronic components is detachably mounted to the X-axis slider 45. A printed-circuit-board imaging device 48 that captures a fiducial mark (not shown) of the circuit board B is attached to the X-axis slider 45.

Figure 2:
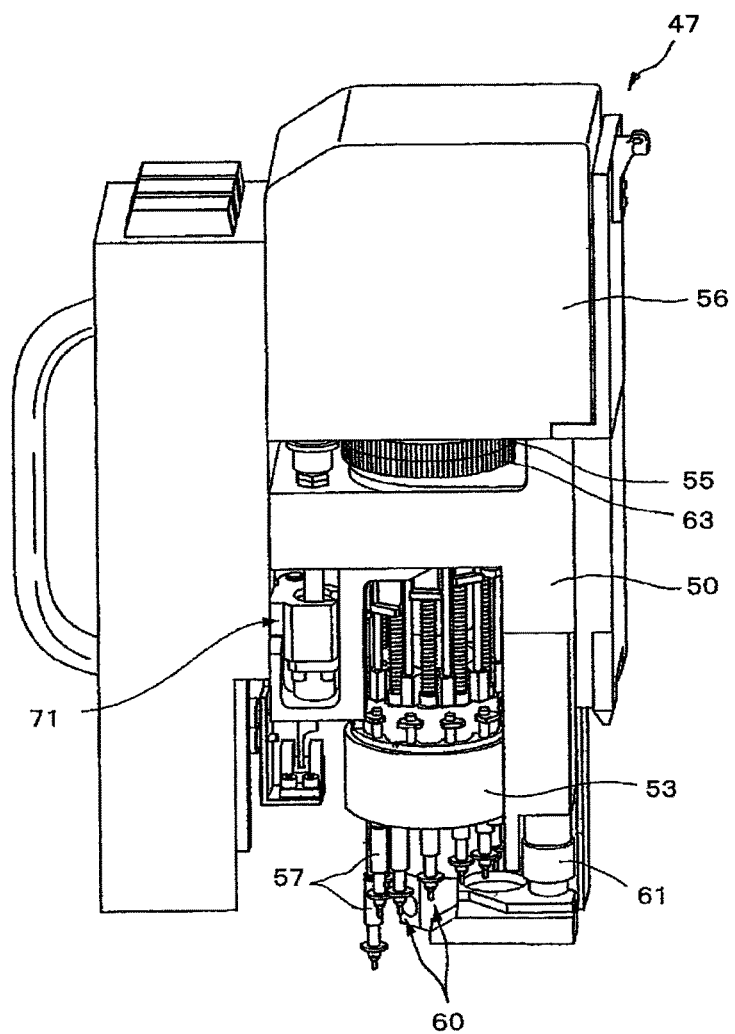
FIG. 2 is a perspective view showing a mounting head including a plurality of suction nozzles.
Figure 3:
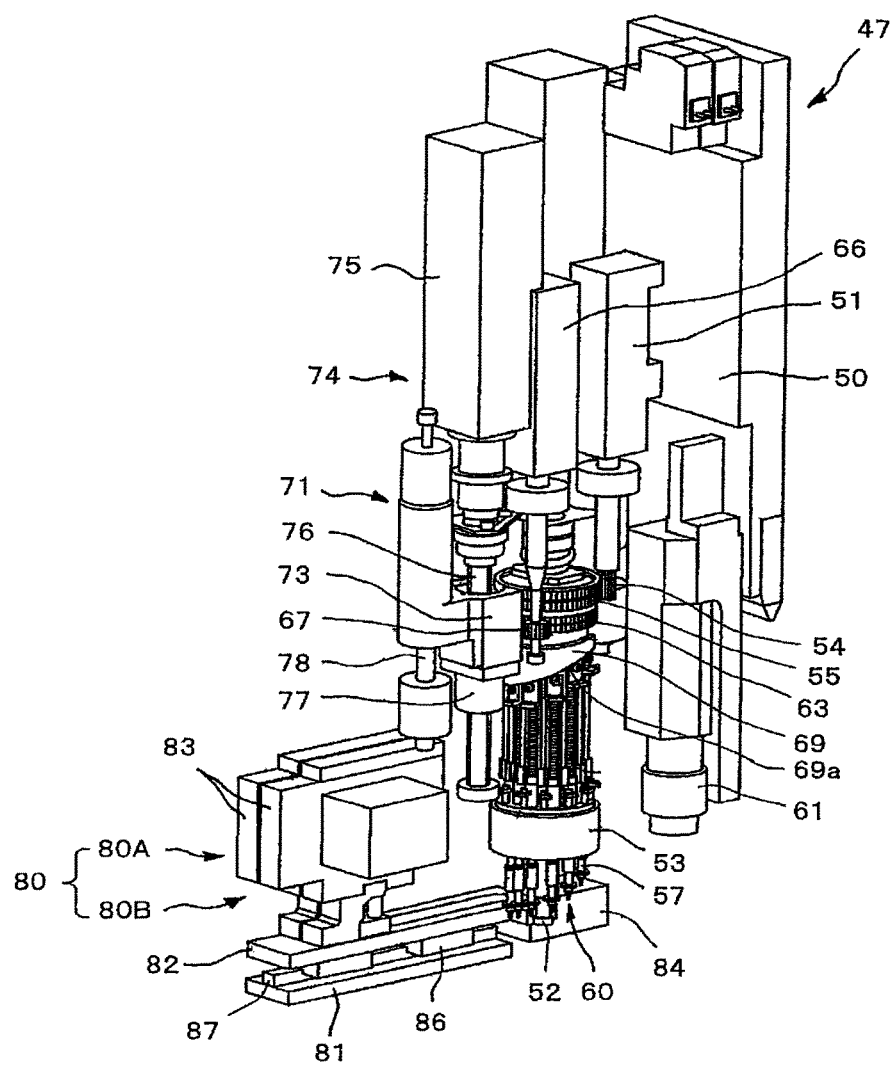
FIG. 3 is perspective view showing a bulk feeder held by the mounting head.
Figure 4:
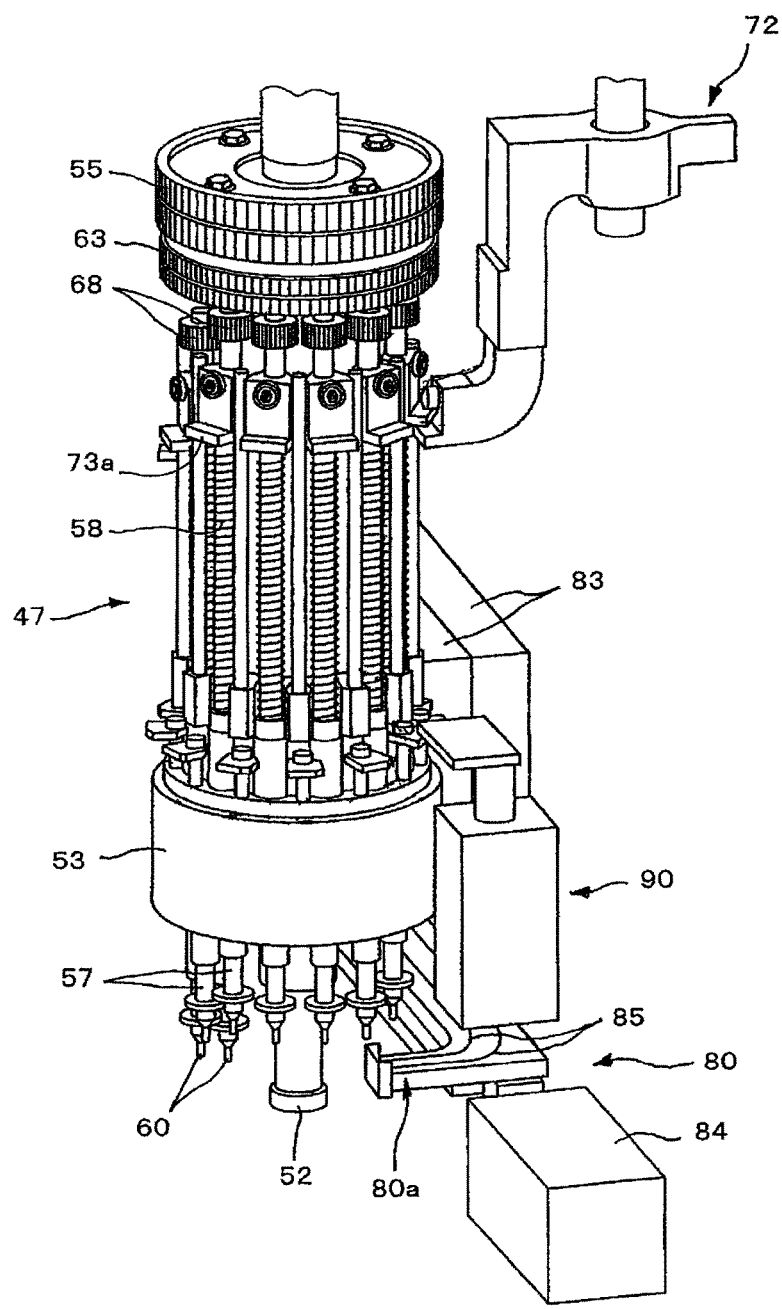
FIG. 4 is a perspective view showing the bulk feeder held by the mounting head when viewed in a different angular direction.

As shown in FIGS. 2, 3 and 4, the mounting head 47 includes a head main body 50 that is detachably mounted to the X-axis slider 45. In FIGS. 3 and 4, a state where a cover 56 (see FIG. 2) which covers the mounting head 47 is removed is illustrated.

A rotational shaft 52 rotated by an R-axis motor 51 is supported by the head main body 50 so as to rotate around a vertical axis line, and a rotary head 53 is fixed to this rotational shaft 52. A drive gear 54 is fixed to an output shaft of the R-axis motor 51, and the drive gear 54 meshes with a driven gear 55 provided at an upper part of the rotational shaft 52. Thus, when the driven gear 55 is rotated by the R-axis motor 51, the rotational shaft 52 and the rotary head 53 rotate around the vertical axis line.

A plurality (for example, 12) of nozzle holders 57 is held on the circumference of the rotary head 53 with an equiangular space so as to be in parallel with a rotational axis line of the rotary head 53, and these nozzle holders 57 are held by the rotary head 53 so as to be lifted in a vertical direction (Z-axis direction) and rotate. The nozzle holders 57 are typically held in lifting end positions by a spring force of springs 58. Suction nozzles 60 that suck the electronic components are detachably held by the respective lower ends of the nozzle holders 57.

Figure 5:
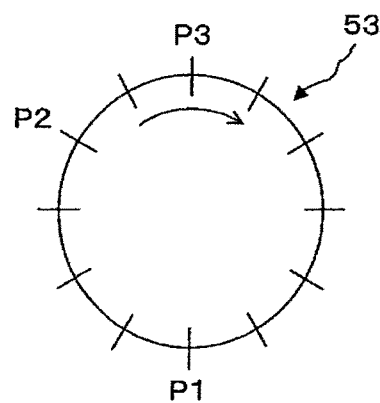
FIG. 5 is a schematic diagram showing stop positions of the suction nozzles by the rotation of a rotational body of the mounting head including the plurality of suction nozzles.

Twelve suction nozzles 60 are sequentially stopped in 12 stop positions by the intermittent rotation of the rotary head 53 with a predetermined angle. In the present embodiment, one of the 12 stop positions is set as a component mounting position P1 where the electronic component is mounted on the circuit board B as shown in FIG. 5, and the component mounting position P1 also serves as a receiving position where the electronic component is received from the tape feeder 21. A component receiving position P2 where the electronic component is received from the bulk feeder, to be described below, is present on a downstream side from the component mounting position P1, and a component imaging position P3 is present on a downstream side from the component receiving position P2 in a position separated by 180 degrees with respect to the component mounting position P1.

A component imaging device 61 including a CCD camera and a light guide device is provided in a position of the head main body 50 corresponding to the component imaging position P3, and the component imaging device 61 is configured to capture the electronic component directly under the suction nozzle 60 positioned in the component imaging position P3. The component imaging device 61 is a movable component imaging device that can move integrally with the mounting head 47.

The component imaging device 61 captures the electronic component sucked by the suction nozzle 60, and detects a center deviation and an angle deviation of the electronic component with respect to the center of the suction nozzle 60. The component imaging device corrects the movement amount of the mounting head 47 in XY directions and corrects the angle thereof by rotating the suction nozzle 60 based on the detected center and angle deviations. Accordingly, it is possible to accurately mount the electronic component in a determined coordinate position on the circuit board B.

Meanwhile, a fixed component imaging device 62 (see FIG. 1) that captures the electronic component sucked by the suction nozzle 60 from the lower side is provided on the base 11. The component imaging device 62 captures the electronic component sucked by the suction nozzle 60 for a period during which the electronic component moves from the component supply position 21a of the component supply section 20 to the circuit board B.

A driven gear 63 is supported integrally with a [theta]-axis gear which is not shown in the drawing by the rotational shaft 52 so as to only rotate. A [theta]-axis motor 66 is fixed to the head main body 50, and the driven gear 63 meshes with a drive gear 67 rotated by the [theta]-axis motor 66. The [theta]-axis gear is provided in a rotation-axis-line direction with a predetermined length, and nozzle gears 68 fixed to upper ends of the respective nozzle holders 57 mesh with the [theta]-axis gear so as to be relatively slid. Thus, when the [theta]-axis gear is rotated by the [theta]-axis motor 66 through the drive gear 67 and the driven gear 63, the 12 nozzle holders 57 are rotated around their own axis lines in an interworking manner.

A cam 69 is fixed to the head main body 50, and upper parts of the nozzle holders 57 engage with a cam surface 69a of the cam 69 through a roller. The cam surface 69a of the cam 69 is formed such that the height thereof in the circumferential direction of the cam 69 is changed, the height thereof in the component mounting position P1 is the lowest, and the height thereof in the component imaging position P3 is the highest. The nozzle holders 57 engage with the cam surface 69a of the cam 69 by an urging force of the springs 58, and are lifted while spinning along the cam surface 69a by the rotation of the rotary head 53.

Two lifting and lowering devices 71 and 72 that lift the nozzle holders 57 with respect to the rotary head 53 in a Z-axis direction are respectively provided in positions of the head main body 50 corresponding to the component mounting position P1 and the component receiving position P2.

One lifting and lowering device 71 provided in the component mounting position P1 includes a lifting and lowering member 73 and a lifting and lowering drive device 74, and the lifting and lowering drive device 74 includes a lifting and lowering motor 75 as a drive source, a screw shaft 76 driven by the lifting and lowering motor 75, and a nut 77 which screws with the screw shaft 76 and is fixed to the lifting and lowering member 73. The lifting and lowering member 73 is guided and lifted by a guide rod 78 by the rotation of the screw shaft 76 due to the lifting and lowering motor 75.

The lifting and lowering member 73 engages with an engagement part 73a of the nozzle holder 57 allocated to the component mounting position P1, and the nozzle holder 57 and the suction nozzle 60 are lowered against the urging force of the springs 58 by lowering the lifting and lowering member 73. The other lifting and lowering device 72 provided in the component receiving position P2 has the same configuration as that of the one lifting and lowering device 71, and the nozzle holder 57 positioned in the component receiving position P2 is lifted to approach or to be separated from the component supply position of the bulk feeder, to be described below.

As shown in FIGS. 3 and 4, a bulk feeder 80 is attached to the head main body 50, and thus, the component can be supplied to the suction nozzle 60 positioned in the component receiving position P2 by the bulk feeder 80. By holding the bulk feeder 80 by the head main body 50, it is possible to supply the component to the suction nozzle 60 and mount the component on the circuit board B without moving the mounting head 47.

In some embodiments, the bulk feeder 80 includes two bulk feeders 80A and 80B that mount different types of components. The bulk feeder 80 includes a feeder main body 81 attached to the head main body 50, a slider 82 that is slidably supported by the feeder main body 81, and a case 83 provided on the slider 82.

The slider 82 of the bulk feeder 80 moves in a direction parallel to a straight line in contact with a circle corresponding to a spinning locus of the nozzle holder 57 and a direction parallel to the Y-axis direction in the present embodiment, by a feeder moving device 84 configured as a cylinder, and respectively positions component supply positions 80a of the bulk feeders 80A and 80B directly under the suction nozzle 60 positioned in the component receiving position P2. In general, the component supply position 80a of the one bulk feeder 80A is positioned in a position corresponding to the suction nozzle 60 on the component receiving position P2.

The two bulk feeders 80A and 80B have the same configuration, and a case 83 of the bulk feeders 80A and 80B is integrally formed. However, as the bulk feeder 80, a plurality of bulk feeders that mounts three or more types of bulk components may be used, or one bulk feeder that mounts one type of bulk component may be used. When the one bulk feeder is used, the slider 82 may be omitted.

Several chip components such as a capacitor or a resistor are accommodated in the case 83 of the bulk feeder 80 (80A, 80B) in a disassembled state. The electronic components accommodated in the case 83 are supplied to a guide path 85 provided on the slider 82 one by one due to an action of vibration, and are arranged in the guide passage 85 in a line. Due to an action of pressurized air supplied to the guide passage 85, the components are supplied to the component supply position 80a including an axis line of the suction nozzle 60 positioned in the component receiving position P2.

A guide block 86 is provided on a lower surface of the slider 82 of the bulk feeder 80, and the guide block 86 is fitted to a guide rail 87 provided at the feeder main body 81 so as to move in the Y-axis direction. The slider 82 is moved in the Y-axis direction by the feeder moving device 84, and can suck the components supplied to the respective component supply positions 80a of the two bulk feeders 80A and 803 by the suction nozzle 60 positioned in the component receiving position P2.

The mounting head 47 is configured such that all the 12 nozzle holders 57 hold the same type of suction nozzles 60, take the electronic components out of the bulk feeder 80 and the tape feeder 21, and mount the taken components on the circuit boards B. The 12 suction nozzles 60 of the mounting head 47 respectively spin to the component mounting position P1 or the component receiving position P2 by the rotation of the rotary head 53, and take the component out of the tape feeder 21 or the bulk feeder 80.

In this case, when the component is taken out of the tape feeder 21 and is mounted on the circuit board B, the mounting head 47 is moved to a position corresponding to the suction nozzle 60 present on the component mounting position P1 in the component supply position 21a of the designated tape feeder 21, and the intermittent rotation of the rotary head 53 and the lifting of the nozzle holders 57 are alternately repeated in this position. In so doing, the components are sequentially sucked by the plurality of suction nozzles 60. Thereafter, for a period during which the mounting head 47 is moved up to a position above the circuit board B, the components are captured by the component imaging device 62, and the center deviation and the angle deviation of the component with respect to the center of the suction nozzle 60 are detected. Thereafter, the mounting head 47 is moved up to the position above the circuit board B, and the intermittent rotation of the rotary head 53 and the lifting of the nozzle holders 57 are alternately repeated in this position. In so doing, the components sucked by the suction nozzles 60 allocated to the component mounting position P1 are sequentially mounted on the circuit board B.

Meanwhile, when the component is taken out of the bulk feeder 80 and is mounted on the circuit board B, while the mounting head 47 is positioned in a position above the circuit board B, or for a period during which the mounting head moves to the position above the circuit board B, the components supplied to the component supply position of the bulk feeder 80 are sequentially sucked by the suction nozzles 60 present on the component receiving position P2. Thereafter, the intermittent rotation of the rotary head 53 and the lifting of the nozzle holders 57 are alternately repeated. In so doing, the components sucked by the suction nozzles 60 are sequentially mounted on the circuit board B.

Accordingly, irrespective of the position of the mounting head 47, the component held by the suction nozzle 60 allocated to the component imaging position P3 can be captured by the component imaging device 61 while receiving the bulk component from the bulk feeder 80 by the suction nozzle 60 allocated to the component receiving position P2, and the component sucked by the suction nozzle 60 positioned in the component mounting position P1 can be mounted on the circuit board B. Accordingly, it is possible to efficiently mount the components.

Reference numeral 90 in FIG. 4 denotes a valve switching device that switches a negative pressure or a positive pressure introduced to the suction nozzle 60.

Figure 6:
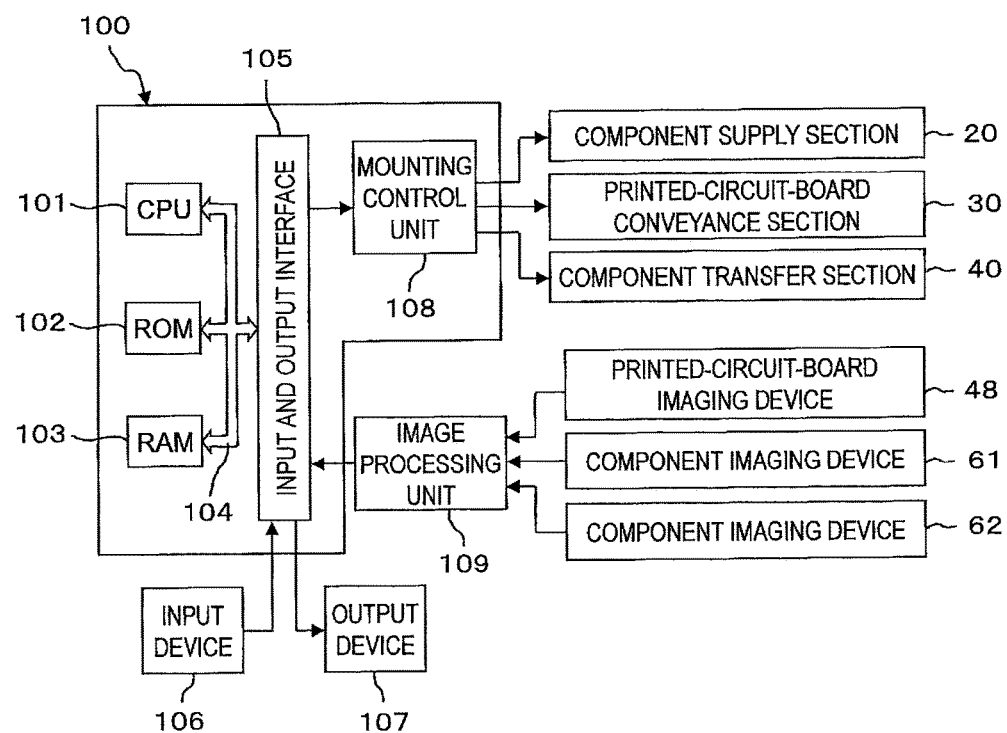
FIG. 6 is a block diagram showing a control device that controls the component mounting system.

FIG. 6 shows a control device 100 that controls the component mounting system 10, and the control device 100 includes a CPU 101, a storage device including a ROM 102 and a RAM 103, and a bus 104 that connects these components. An input and output interface 105 is connected to the bus 104, and an input device 106 including a keyboard and a mouse, and an output device 107 including a display unit that provides a necessary guide (display) to an operator are connected to the input and output interface 105.

Amounting control unit 108 that controls the component supply section 20, the printed-circuit-board conveyance section 30 and the component transfer section 40 is connected to the input and output interface 105, and an image processing unit 109 that performs image processing on image data captured by the printed-circuit-board imaging device 48 and the component imaging devices 61 and 62 is connected to the input and output interface. A bulk component determining program, to be described below, is stored in the ROM 102 of the control device 100, and component data PDA (see FIG. 7) is stored in the RAM 103.

Figure 7:
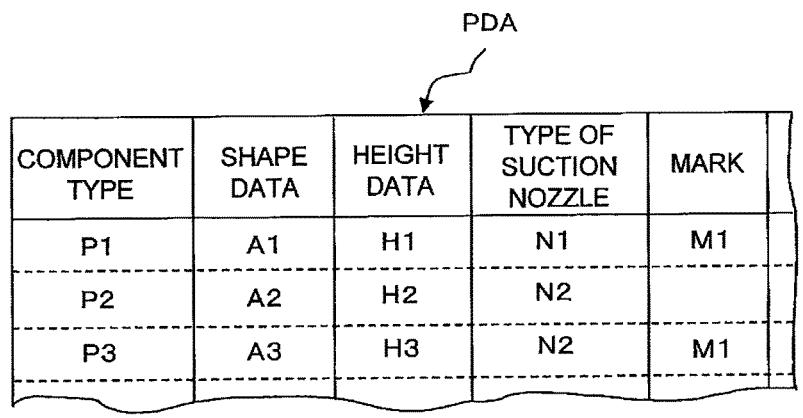
FIG. 7 is a diagram showing an example of component data.

Shape data, height data, the type of the suction nozzle 60 to be used, and a mark indicating whether or not the component is appropriate for the bulk component are assigned to the component data PDA for the respective components (PA, PB, PC, . . . ). In some embodiments, for example, a mark M1 shown in FIG. 7 is assigned to the components appropriate for the bulk component.

Figure 8:
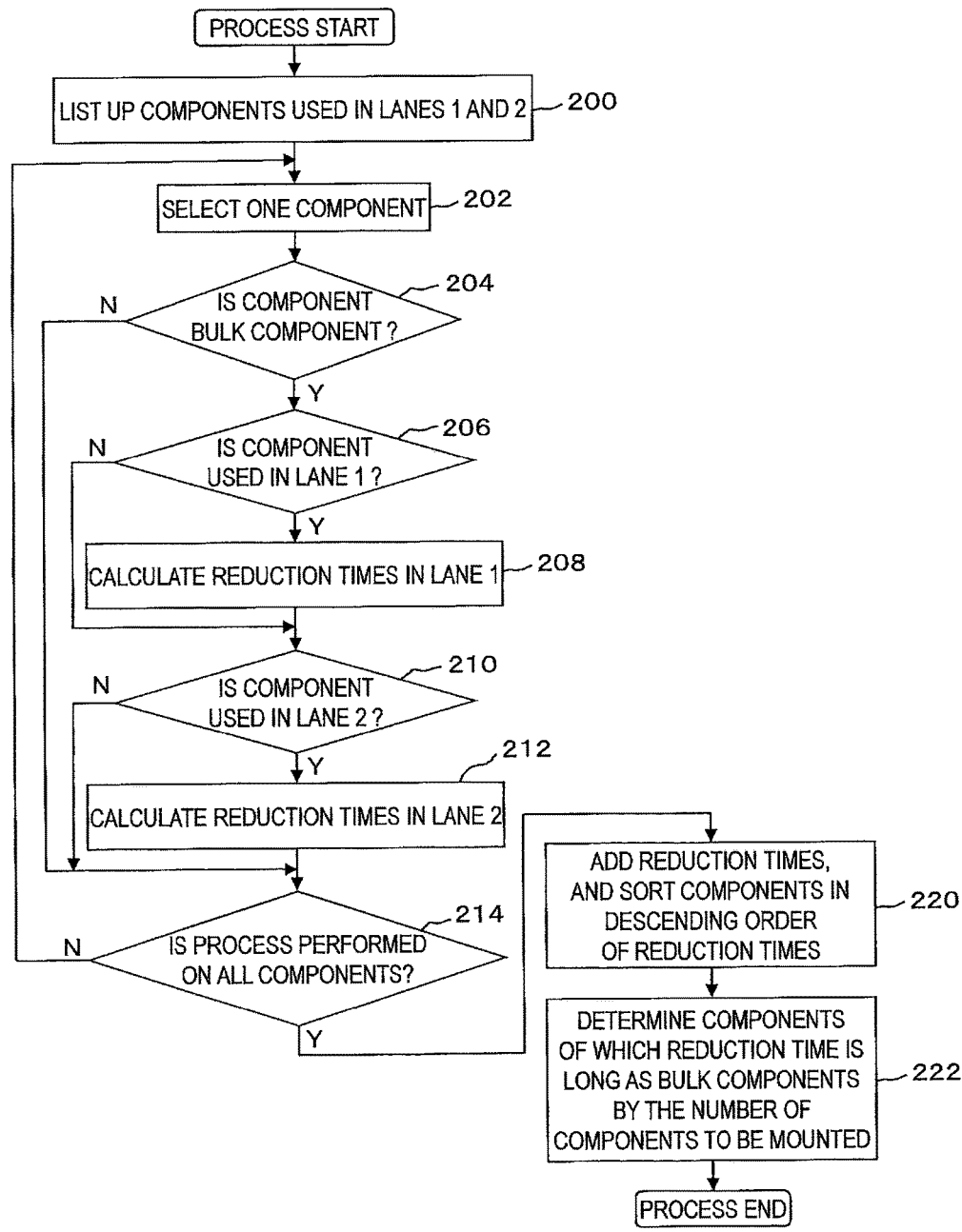
FIG. 8 is a flowchart showing processes for determining a bulk component to be mounted on the bulk feeder according to the first embodiment.

Next, the processes of the CPU 101 for determining the component (bulk component) to be mounted on the bulk feeder 80 will be described by referring to a flowchart of FIG. 8.

The processes of the flowchart are performed before different types of circuit boards B to be input to the two-row conveyance lanes 31 and 32 are produced. That is, a simulation in which among the components required to produce the different types of circuit boards B, the components that can reduce the production time of the circuit boards B to the maximum extent are determined as the bulk components to be mounted on the bulk feeder 80 is performed. As a result, the remaining components are supplied by the tape feeder 21 of the component supply section 20.

Firstly, in step 200, the components used in the first and second conveyance lanes 31 and 32 (hereinafter, referred to as lanes 1 and 2) are listed. Subsequently, in step 202, one component (hereinafter, referred to as a first component PA) of the listed components is selected. Subsequently, in step 204, it is determined whether or not the first component PA is the bulk component (component appropriate for the bulk component) by referring to the mark M1 (see FIG. 7) of the component data PDA stored in the RAM 103.

When the determined result in step 204 is Y (YES), that is, when it is determined that the component is the bulk component, the process proceeds to step 206. When the determined result is N (NO), the process proceeds to step 214. In step 206, it is determined whether or not the first component PA is used in the lane 1. When the determined result is Y, the process proceeds to step 208, and when the determined result is N, the process proceeds to step 210.

In step 208, a simulation in which a reduction time T1A in the lane 1 when the first component PA is the bulk component to be mounted on the bulk feeder 80 is calculated is performed, and the calculated reduction time T1A is stored in a predetermined storage area (storage area that stores the reduction time T1A of the first component PA in the lane 1) of the RAM 103.

That is, in order for the suction nozzle 60 to suck the component PA and for the sucked component to be mounted on the circuit board B, the reduction time T1A of the first component PA in the lane 1 is calculated by multiplying a movement time TA required to allow the mounting head 47 to reciprocate between the component supply section 20 and the circuit board B on the lane 1 by a reciprocating movement number NA (TA×NA). The reciprocating movement number NA is obtained based on component mounting data on the circuit board B stored in the RAM 103.

Here, the movement time TA is a value obtained by doubling (reciprocating) a movement time from a central coordinate of the circuit board B on the lane 1 to the component supply section 20. In some embodiments, since the mounting head 47 includes the rotary head 53 that can intermittently rotate the plurality of suction nozzles 60, the components are sucked by the 12 suction nozzles 60 while intermittently rotating the rotary head 53 in a state where the mounting head 47 is positioned in the component supply section 20, and thus, the reciprocating movement number NA is a value obtained by dividing the number of components to be mounted taken out of the component supply section 20 by the number (12) of suction nozzles 60.

Figures 13A, 13B:
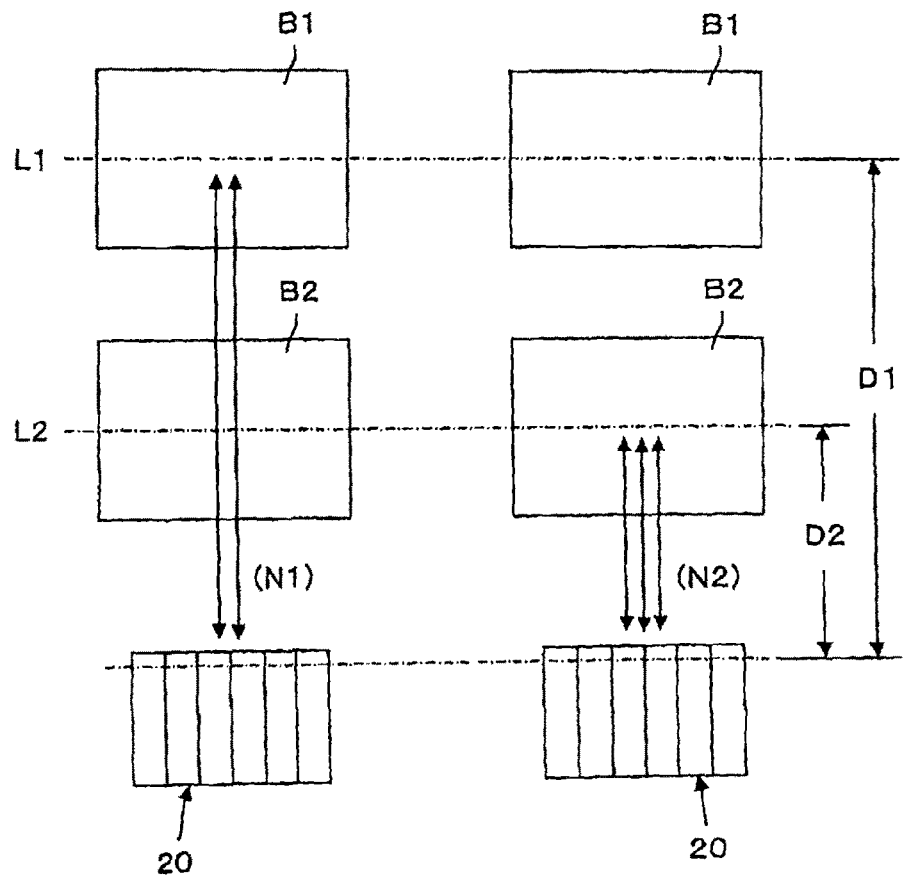
FIG. 13 is an explanatory diagram for describing an amount of time required when a component is supplied by a fixed component supply device and the component is mounted on a printed circuit board.

Meanwhile, the movement number NA depends on the number of components to be mounted, and the number of components to be mounted is obtained based on the mounting data of the components on the circuit board B. The NA is a value obtained by doubling (reciprocating) a time corresponding to a movement time (movement distance) required to allow the mounting head 47 to move to the component supply section 20 in order to suck the component, that is, a time required to allow the mounting head to move by a movement distance (D1 of FIG. 13) from the central coordinate of the circuit board B on the lane 1 to the component supply section 20. When the component is selected as the bulk component to be mounted on the bulk feeder 80 held by the mounting head 47, since it is not necessary to allow the mounting head 47 to move to the component supply section 20 in order to suck the component by the suction nozzles 60, an amount of time required for the movement becomes the reduction time.

Thereafter, in step 210, it is determined whether or not the first component PA is used in the lane 2. When the determined result is Y, the process proceeds to step 212, and when the determined result is N, the process proceeds to step 214. In step 212, a simulation in which a reduction time T2A in the lane 2 when the first component PA is used as the bulk component is calculated as described above is performed, and the calculated reduction time T2A is stored in a predetermined storage area of the RAM 103.

As stated above, the reduction time T1A of the first component PA in the lane 1 and the reduction time T2A of the first component PA in the lane 2 are stored in the respective areas of the RAM 103 as shown in FIG. 9.

Subsequently, in step 214, it is determined whether or not the calculation process of the reduction time on all the components listed in step 200 is ended. When the determined result is N, the process returns to step 202. In step 202, the next component (second component PB) is selected, and reduction times T1B and T2B in the lanes 1 and 2 when the second component PB is used as the bulk component are calculated by repeatedly performing the processes of step 204 to step 212.

As a result of repeatedly performing such processes, when the determined result of step 214 is Y (the process on all the components PA, PB, PC . . . is ended), the process proceeds to step 220. In step 220, the reduction times (T1A, T1B, . . . ) for all the components in the lane 1 and the reduction times (T2A, T2B, . . . ) for all the components in the lane 2 are added, and total reduction times (T1A+T2A, T1B+T2B, . . . ) for all the components are obtained. The components are sorted in descending order of total reduction times. In FIG. 9, a case where components PC and PE are not used in the lane 2 is illustrated.

Subsequently, in step 222, the bulk components are determined from the components of which the total reduction time is long by the number corresponding to the number of components that can be mounted on the bulk feeder 80. That is, in some embodiments, since the two bulk feeders 80A and 80B are held by the mounting head 47, two different types of components of which the total reduction time is long are determined as the bulk components.

The two different types of bulk components determined by such processes are mounted on the two bulk feeders 80A and 80B, the remaining components are accommodated in the respective tape feeders 21 of the component supply section 20, and a production planning operation for producing the circuit boards B is performed. That is, a data creating operation for creating component supply designating data for designating that the components are supplied from the bulk feeder 80 or the tape feeder 21 is performed, and a preparation operation in which the bulk components or the tape components are ordered is performed.

Step 200 to step 222 constitute a bulk component determining section that calculates operation times when the components supplied from the component supply section 20 are moved to the circuit boards B of the two-row conveyance lanes 31 and 32 for all the components and determines the bulk components to be mounted on the bulk feeder 80 based on the calculated operation times. Step 200 to step 214 constitute operation time calculating means (operation time calculating unit) for respectively calculating operation times when the components supplied from the component supply section 20 are moved to the circuit boards B on the two-row conveyance lanes 31 and 32. Step 220 and step 222 constitute selection means (selection unit) for selecting the components of which the operation time is long, among the operation times of the components on the plurality of different types of circuit boards B which are calculated by the operation time calculating means, as the bulk components.

As mentioned above, according to the first embodiment, among the components mounted on the two types of circuit boards B input to the two-row conveyance lanes 31 and 32, the components that can reduce the production time of the circuit boards B the most are determined as the bulk components through the simulation by mounting the components on the bulk feeder 80 held by the mounting head 47, unlike a case where the components are accommodated in the tape feeder 21 of the component supply section 20. In so doing, it is possible to select the components that can most effectively reduce the production time as the bulk components in producing the two types of circuit boards B conveyed to the two-row conveyance lanes 31 and 32.

Thus, it is possible to implement the component mounting system 10 and the bulk component determining method capable of optimizing the arrangement of the components on the component supply section and the bulk feeder, and it is possible to effectively reduce the production time when different types of circuit boards B are produced.

Next, a second embodiment of the present disclosure will be described with reference to FIGS. 10 to 12. The second embodiment is the same as the first embodiment in that in the component mounting system 10, the bulk feeder 80 is held by the mounting head 47 in addition to the component supply section 20 (tape feeder 21) provided at the base 11, and is different from the first embodiment in that a plurality of different types of printed circuit boards, for example, 3 different types of printed circuit boards is conveyed by a single-row conveyance lane.

In the second embodiment, among all components used in first to third production jobs (hereinafter, referred to as Production Job 1, Production Job 2, and Production Job 3) that produce three types of printed circuit boards, components that contribute to a reduction in the production time the most are determined as bulk components by the same method described in the first embodiment.

Figure 10:
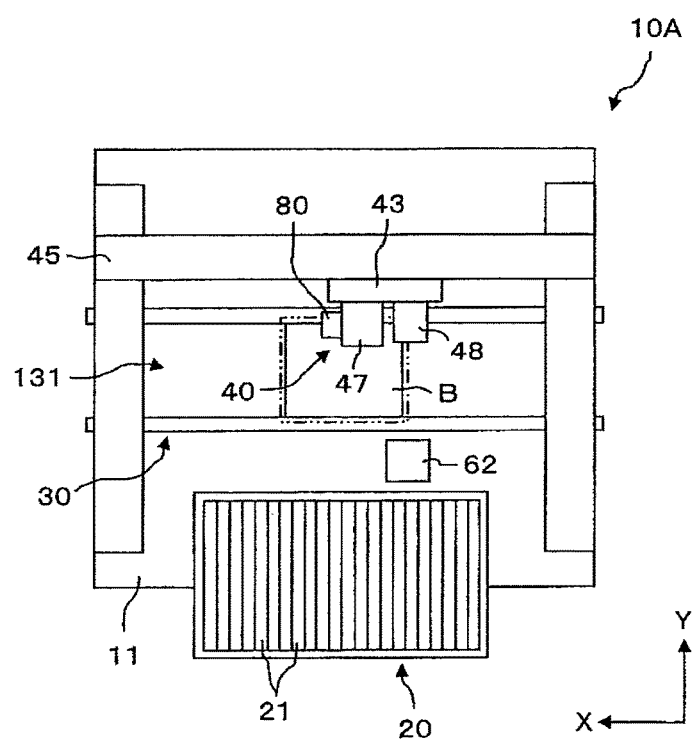
FIG. 10 is a schematic plan view showing a component mounting system according to a second embodiment of the present disclosure.

FIG. 10 shows the outline of a component mounting system 10A according to the second embodiment. Since the component mounting system according to the second embodiment has basically the same configuration as that of the first embodiment except for the fact that the printed-circuit-board conveyance section 30 includes a single-row conveyance lane 131, the same configuration as that described in the first embodiment will be assigned the same reference numeral, and thus, the description thereof will be omitted.

In the second embodiment, three different types of printed circuit boards are input to the conveyance lane 131 of the printed-circuit-board conveyance section 30 for each rod or in a random manner. Among the components to be mounted on the three types of printed circuit boards B, one type of component or several types of components are accommodated in the bulk feeder 80 held by the mounting head 47, and the remaining components are accommodated in the tape feeder 21. In so doing, the three types of printed circuit boards B can be produced without tooling change.

Figure 11:
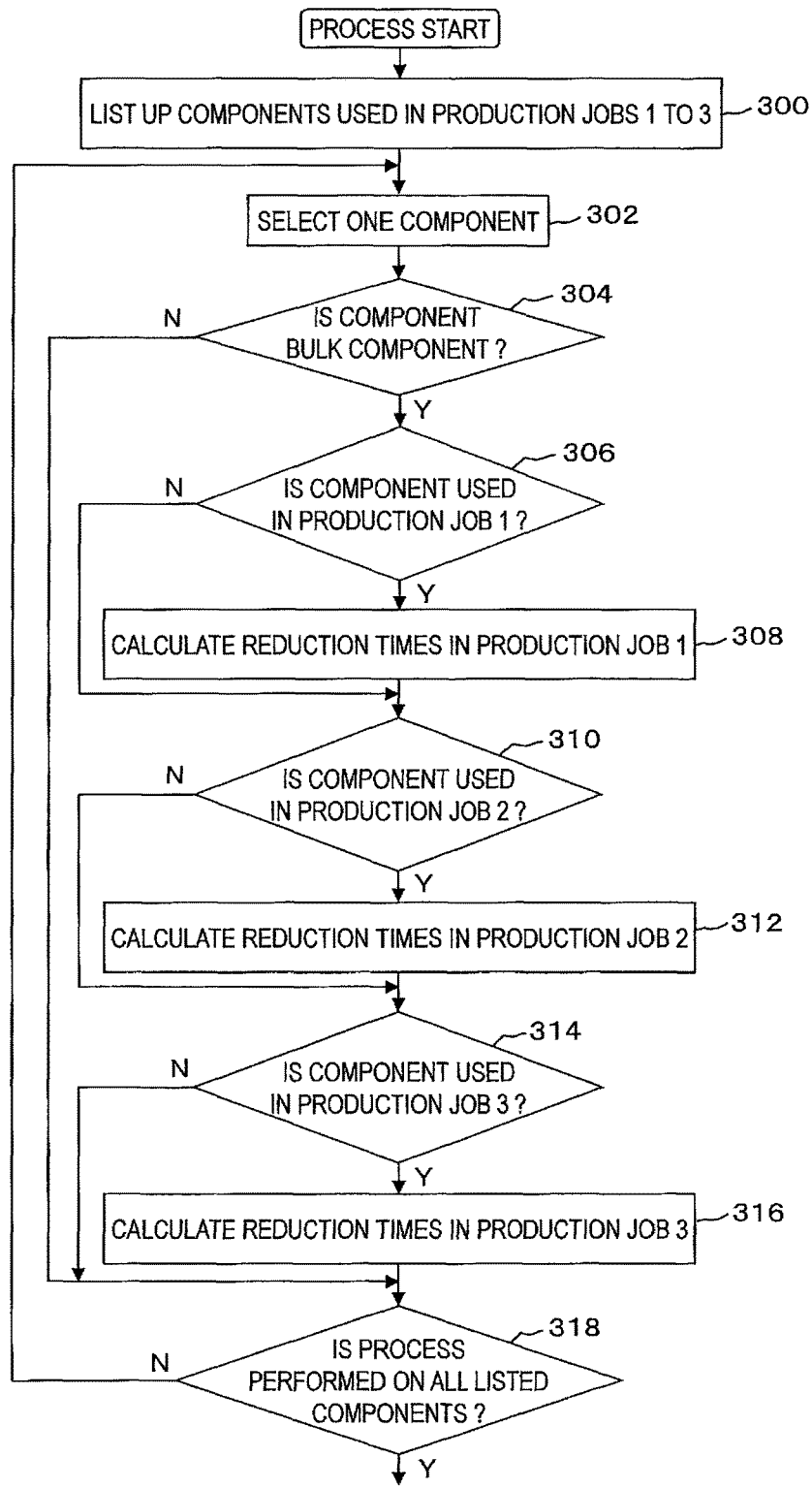
FIG. 11 is a flowchart showing processes for determining a bulk component to be mounted on a bulk feeder according to the second embodiment.

FIG. 11 is a flowchart for determining the components to be mounted on the bulk feeder according to the second embodiment, and since the basic processing content is the same as that described in the first embodiment, the flowchart of FIG. 11 will be briefly described. Since the processes of FIG. 11 correspond to step 200 to step 214 of FIG. 8 and are the same as step 220 and step 222, the description thereof will be omitted.

Firstly, in step 300, the components used in the productions (hereinafter, referred to as Jobs 1, 2 and 3) of the three types of printed circuit boards input to the conveyance lane 131 are listed. Subsequently, in step 302, one component (hereinafter, this component is referred to as a component PA) of the listed components is selected, and in the subsequent step 304, it is determined whether or not the component PA is the bulk component by referring to the mark M1 (see FIG. 7) of the component data PDA.

When it is determined that the component is the bulk component in step 304, the process proceeds to step 306. In step 306, it is determined whether or not the component PA is used in Production Job 1. When the determined result is Y, the process proceeds to step 308, and in step 308, a simulation in which a reduction time in Production Job 1 when the component PA is the bulk component to be mounted on the bulk feeder 80 is calculated is performed, and the calculated reduction time T1A' is stored in a predetermined storage area of the RAM 103 as shown in FIG. 12.

Thereafter, in step 310, it is determined whether or not the component PA is used in Production Job 2. When the determined result is Y, the process proceeds to step 312. In step 312, a simulation in which a reduction time in Production Job 2 when the component PA is the bulk component to be mounted on the bulk feeder 80 is calculated is performed, and the calculated reduction time T2A' is stored in a predetermined storage area of the RAM 103.

Subsequently, in step 314, it is determined whether or not the component PA is used in Production Job 3. When the determined result is Y, the process proceeds to step 316. In step 316, a simulation in which a reduction time T3A' in Production Job 3 when the component PA is the bulk component to be mounted on the bulk feeder 80 is calculated is performed, and the calculated reduction time T3A' is stored in a predetermined storage area of the RAM 103.

Thereafter, in step 318, it is determined whether or not the process on all the components listed in step 300 is ended. When the determined result is N, the process returns to step 302. In step 302, the next component PB is selected, and the processes of step 304 to step 316 are repeatedly performed. When the determined result of step 318 is Y, the operation time calculating process is ended, and in the subsequent steps (corresponding to steps 220 and 222 of FIG. 8), the total reduction times for all the components in Production Jobs 1, 2 and 3 are obtained, and the bulk component to be mounted on the bulk feeder 80 is determined based on this result.

According to the second embodiment, in the component mounting system 10A including the single conveyance lane 131, the components used in Production Jobs 1, 2 and 3 for producing the plurality of different types of circuit boards B are prepared in the component supply section 20, and it is possible to determine an optimum bulk component when the plurality of circuit boards B are produced without tooling change. Accordingly, it is possible to effectively reduce the production time when the plurality of different types of circuit boards B is produced.

Although it has been described in the aforementioned embodiments that the bulk feeder 80 is provided at the head main body 50 of the mounting head 47, the bulk feeder 80 may be attached to a member that integrally moves with the mounting head 47.

Although it has been described in the aforementioned embodiments that the mounting head 47 includes the rotary head 53 that holds the plurality of suction nozzles 60, the mounting head 47 may include at least one suction nozzle.

It has been described in the aforementioned embodiments that the mark M1 appropriate for the bulk component is assigned to the components of the component data PDA, the simulation in which the reduction time of the component to which the mark M1 is assigned is calculated is performed, and the component of which the reduction time is longest is determined as the bulk component to be mounted on the bulk feeder 80. However, the reduction times of all the components mounted on the plurality of different types of circuit boards B may be calculated, and the bulk component to be mounted on the bulk feeder 80 may be determined by generally determining whether or not the component of which the reduction time is long is appropriate for the bulk component.

Although it has been described in the aforementioned embodiments that the component imaging device 62 is provided on the fixed side in addition to the component imaging device 61 provided at the mounting head 47, the fixed-side component imaging device 62 may be omitted.

The configuration of the component mounting systems 10 and 10A described in the embodiments, specifically, the configuration of the mounting head 47 is merely a preferred example of the embodiment of the present disclosure, and is not limited to the specific configuration.

In such a manner, the present disclosure may adopt various aspects without departing from the gist of the present disclosure described in the claims.

INDUSTRIAL APPLICABILITY

A component mounting system and a bulk component determining method used in the same according to the present disclosure are appropriate for a system and a method that hold a bulk feeder by a mounting head.

REFERENCE SIGNS LIST 10, 10A: Component mounting system, 20: Component supply section, 30: Printed-circuit-board conveyance section, 31, 32, 131: Conveyance lane, 40: Component transfer section, 47: Mounting head, 50: Head main body, 53: Rotary head, 57: Nozzle holder, 60: Suction nozzle, 61: Component imaging device, 71, 72: Lifting and lowering device, 80: Bulk feeder, Steps 200 to 222: Bulk component determining section, Steps 200 to 214: Operation time calculating means, Steps 220, 222: Selection means, B: Printed circuit board

The invention claimed is:
1. A component mounting system, comprising:
conveyance lanes that convey a plurality of different types of printed circuit boards;
at least one tape feeder that supplies components to be mounted on the plurality of printed circuit boards;
a mounting head that includes a plurality of suction nozzles which suck the components supplied from the at least one tape feeder and bulk components supplied by a bulk feeder that is integrally held by the mounting head, and the mounting head mounts the components and the bulk components sucked by the suction nozzles on the printed circuit boards; and
circuitry configured to perform a simulation in which operation times when the components supplied from the at least one tape feeder are moved on the plurality of printed circuit boards on the conveyance lanes are calculated for all of the components to be mounted on the plurality of different types of printed circuit boards, and determine which of all of the components is a bulk component to be mounted based on the calculated operation times for all of the components, wherein
one of the components sucked by one of the plurality of suction nozzles is allocated to a first rotation stop position of the plurality of suction nozzles by a rotary head and is captured by a component imaging device while one of the bulk components sucked by another one of the plurality of suction nozzles is allocated to a second rotation stop position of the plurality of suction nozzles by the rotary head.

2. The component mounting system according to claim 1, wherein the conveyance lanes include two conveyance lanes that are arranged in parallel, each of the two conveyance lanes conveying a different type of the plurality of printed circuit boards, and the components supplied from the at least one tape feeder are mounted on the respective printed circuit boards conveyed by the two conveyance lanes.

3. The component mounting system according to claim 2, wherein the circuitry is further configured to calculate operation times when the components supplied from the at least one tape feeder are transferred to the plurality of printed circuit boards on the two conveyance lanes, and select another one of the components of which the operation time is relatively long as a bulk component, among the operation times calculated for all the components on the plurality of different types of printed circuit boards.

4. The component mounting system according to claim 1, wherein the at least one tape feeder includes a plurality of tape feeders, each of the plurality of tape feeders including a supply position at an end of each respective tape feeder, and wherein the bulk feeder includes a case that stores the bulk components and includes a guide passage that supplies the bulk components from the case to a supply position that corresponds with the second stop position of the plurality of suction nozzles on the mounting head.

5. The component mounting system according to claim 4, wherein the circuitry is further configured to perform the simulation in which operation times when the components supplied from the supply position at the end of each respective tape feeder are calculated.

6. The component mounting system according to claim 1, wherein the one of the components sucked by the one of the plurality of suction nozzles is allocated to the first rotation stop position of the plurality of suction nozzles by the rotary head and is captured by the component imaging device while the one of the bulk components sucked by the another one of the plurality of suction nozzles is allocated to the second rotation stop position of the plurality of suction nozzles by the rotary head and another one of the components positioned in a third rotation stop position of the plurality of suction nozzles is mounted on one of the plurality of printed circuit boards by the mounting head.

* * * * *